(12) United States Patent
Tsuchida

(10) Patent No.: US 11,081,381 B2
(45) Date of Patent: Aug. 3, 2021

(54) CERAMIC STRUCTURE

(71) Applicant: NGK SPARK PLUG CO., LTD., Aichi (JP)

(72) Inventor: Atsushi Tsuchida, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 323 days.

(21) Appl. No.: 16/372,535

(22) Filed: Apr. 2, 2019

(65) Prior Publication Data
US 2019/0311934 A1 Oct. 10, 2019

(30) Foreign Application Priority Data

Apr. 4, 2018 (JP) .............................. JP2018-072140

(51) Int. Cl.
*B22F 3/00* (2021.01)
*H01L 21/683* (2006.01)
(Continued)

(52) U.S. Cl.
CPC ........ *H01L 21/6833* (2013.01); *B23K 1/0008* (2013.01); *C04B 37/021* (2013.01); *H01L 21/67103* (2013.01); *B23K 2103/08* (2018.08); *B23K 2103/52* (2018.08); *C04B 2237/366* (2013.01); *C04B 2237/403* (2013.01); *Y10T 428/12056* (2015.01)

(58) Field of Classification Search
None
See application file for complete search history.

(56) References Cited

U.S. PATENT DOCUMENTS 5,989,731 A 11/1999 Arisawa et al.
6,617,514 B1 9/2003 Ushikoshi et al.
(Continued)

FOREIGN PATENT DOCUMENTS

JP H09-194909 A 7/1997
JP H11-012053 A 1/1999
(Continued)

OTHER PUBLICATIONS

Korean Intellectual Property Office, Office Action (Notification of Reason for Refusal) issued in corresponding Application No. 10-2019-0038702, dated Dec. 1, 2020.

*Primary Examiner* — Seth Dumbris
(74) *Attorney, Agent, or Firm* — Stites & Harbison, PLLC; Jeffrey A. Haeberlin; James R. Hayne

(57) ABSTRACT

A ceramic structure includes a ceramic base member having a main face; a hole extending from the main face into the ceramic base member; a metal electrode layer embedded in the ceramic base member; a conductive member embedded in the ceramic base member so as to be electrically connected to the metal electrode layer and form a bottom of the hole; a first metal member joined to the conductive member by a brazing material and having an average linear expansion coefficient not less than the average linear expansion coefficient of the conductive member; one or a plurality of second metal members having a greater average linear expansion coefficient than the first metal member; and a metal terminal joined to the one or the plurality of second metal members and having a greater average linear expansion coefficient than each second metal member.

8 Claims, 4 Drawing Sheets

(51) Int. Cl.
    *H01L 21/67*     (2006.01)
    *C04B 37/02*     (2006.01)
    *B23K 1/00*     (2006.01)
    *B23K 103/08*     (2006.01)
    *B23K 103/00*     (2006.01)

(56) References Cited

U.S. PATENT DOCUMENTS

| | | | |
|---|---|---|---|
| 8,414,704 B2 * | 4/2013 | Fujii | H01L 21/67103 |
| | | | 118/728 |
| 2009/0277895 A1 * | 11/2009 | Komatsu | C23C 16/4586 |
| | | | 219/438 |
| 2019/0226512 A1 * | 7/2019 | Raj | C04B 37/023 |

FOREIGN PATENT DOCUMENTS

| | | |
|---|---|---|
| JP | 3776499 B2 | 5/2006 |
| JP | 2008-198975 A | 8/2008 |

* cited by examiner

CERAMIC STRUCTURE

CROSS REFERENCE TO RELATED APPLICATION

The present invention claims priority to Japanese Patent Application No. 2018-072140, which was filed on Apr. 4, 2018, the disclosure of which is herein incorporated by reference in its entirety.

BACKGROUND OF THE INVENTION

Field of the Invention

The present invention relates to a ceramic structure.

Description of Related Art

Conventionally, forming a hole by machining in a base body formed from aluminum nitride (ceramic), causing a metal electrode inside the base body to be exposed in the hole, inserting a cylindrical metal terminal into the hole, and brazing the front end surface of the metal terminal have been proposed. However, there are cases where the base body is repeatedly exposed to high temperature in a use environment. When a heat cycle test between room temperature and 600° C. and a retention test at 600° C. for a long period are performed, there are cases where a crack occurs at an inner side face, of the base body, which defines the hole. As a countermeasure for this, a technology of reducing the stress remaining in the base body so as to suppress occurrence of a crack in the base body has been proposed (for example, Patent Document 1).

RELATED ART DOCUMENT

Patent Document 1 is Japanese Patent No. 3776499.

BRIEF SUMMARY OF THE INVENTION

According to the technology of Patent Document 1, a metal member and a ceramic member having formed therein a housing hole for housing the metal member are joined to each other. The metal member is housed in the housing hole, and a gap portion having a width not less than 0.2 mm is provided between the metal member and the side wall face, of the ceramic member, which defines the housing hole at the bottom face side of the metal member. A joining layer which joins the metal member and the ceramic member is provided between the bottom face of the metal member and the bottom face of the housing hole, and part of the joining layer is exposed in the gap portion so as to cover the bottom face of the housing hole.

When the metal member and the ceramic member are to be joined, the metal member is housed in the housing hole. The metal member has: a body of the metal member; and an end portion protruding from this body toward the bottom-face side of the housing hole and having a smaller cross-sectional dimension than the body. The gap portion is surrounded by the end portion, the body, the side wall face of the ceramic member defining the housing hole, and the bottom face of the housing hole.

The bottom of the housing hole and the bottom of the metal member are brazed to each other. Part of the brazing material flows into the gap portion between the end portion and the side wall face. In the brazing material having flowed into the gap portion, a depressed portion is formed between the end portion and the side wall face. The joining layer exposed in the gap portion does not take an elongated form that is firmly restricted between the ceramic member and the metal member. Therefore, even if a difference in thermal expansion between the brazing material and the ceramic member occurs, such a difference is absorbed to some extent due to the flow or deformation of the brazing material.

However, in the above technology, an embedded metal having a certain volume is required in order to ensure electric connection with an electrode built-in the ceramic member; there is a large difference in the average linear expansion coefficient between the metal member (terminal containing Ni) and the embedded metal; and the embedded metal is inevitably subjected to not less than 1800° C. of sintering temperature in the course of manufacturing the ceramic member, resulting in reduced strength and embrittlement thereof. For such reasons, mere adjustment of the shape of the end portion of the metal member as a terminal and the form of the gap between the housing hole and the metal member (terminal) cannot alleviate the stress between the embedded metal and the metal member. Thus, a crack could occur after a long period of use.

In view of the above circumstances, an object of the present invention is to provide a ceramic structure that can prevent occurrence of a crack in a ceramic base member or a conductive member even after a long period of use.

[1] In order to attain the above object, a ceramic structure of the present invention includes:

a ceramic base member having a main face;

a hole extending from the main face into the ceramic base member;

a metal electrode layer embedded in the ceramic base member;

a conductive member embedded in the ceramic base member so as to be electrically connected to the metal electrode layer and form a bottom of the hole;

a first metal member joined to the conductive member by a brazing material and having an average linear expansion coefficient not less than an average linear expansion coefficient of the conductive member;

one or a plurality of second metal members which are disposed on a face, of the first metal member, that is at a side opposite to a face, of the first metal member, that is opposed to the conductive member, and which have a greater average linear expansion coefficient than the first metal member; and a metal terminal which is at least partially located in the hole, which is joined to the one or the plurality of second metal members, and which has a greater average linear expansion coefficient than each second metal member, wherein a distance between the conductive member and the metal terminal is not less than 1.5 mm, and a ratio of a thickness of the first metal member and a thickness of the second metal member is less than 4.

In other words, a ceramic structure of the present invention includes: a ceramic base member having a main face, the ceramic base member defining a hole extending from the main face into the ceramic base member; a metal electrode layer embedded in the ceramic base member; a conductive member embedded in the ceramic base member so as to be electrically connected to the metal electrode layer, the conductive member forming a bottom of the hole; a first metal member joined to the conductive member by a brazing material, the first metal member having a first front surface that is opposed to the conductive member and a first back surface that is opposite to the first front surface, and the first metal member having an average linear expansion coefficient not less than an average linear expansion coefficient of the conductive member; one or more second metal members disposed at the first back surface of the first metal member, each of the one or more second metal members having a greater average linear expansion coefficient than the average linear expansion coefficient of the first metal member; and a metal terminal at least partially located in the hole and joined to the one or more second metal members, the metal terminal having a greater average linear expansion coefficient than the average linear expansion coefficient of each of the one or more second metal members, wherein a distance between the conductive member and the metal terminal is not less than 1.5 mm, and a ratio of a thickness of the first metal member and a thickness of the one or more second metal members is less than 4.

In this configuration, the conductive member embedded in the ceramic base member is subjected to a sintering temperature and grain growth occurs therein, and thus, the conductive member becomes vulnerable and the strength is reduced. However, the first metal member having an average linear expansion coefficient not less than the average linear expansion coefficient of the conductive member is placed on the conductive member, and further, the second metal member having an average linear expansion coefficient greater than the average linear expansion coefficient of the first metal member and smaller than the average linear expansion coefficient of the metal terminal is placed on the first metal member. Accordingly, the stress caused by the difference in the average linear expansion coefficient between the conductive member and the metal terminal is received by the first metal member and the second metal member, whereby the stress acting on the conductive member can be suppressed.

As described above, the conductive member is joined with the first metal member, the second metal member, and the metal terminal in this order with the average linear expansion coefficients thereof graded so as to be increased in an ascending order. Accordingly, the stress acting between the conductive member and the first metal member, the stress acting between the first metal member and the second metal member, and the stress acting between the second metal member and the metal terminal can be suppressed. Therefore, occurrence of a crack in the conductive member can be prevented.

Further, the first metal member and the second metal member, which are relatively thick and thus realize a distance of not less than 1.5 mm between the conductive member and the metal terminal, are disposed between the conductive member and the metal terminal. Therefore, a large distance between the conductive member and the metal terminal can be realized. Accordingly, the stress acting between the conductive member and the metal terminal can be suppressed. Since the ratio of the thickness of the first metal member and the thickness of the second metal member is less than 4, the proportion of the thickness of the first metal member to the second metal member is not too large, and the advantageous effect of the functionally-graded average linear expansion coefficient of the first metal member can be sufficiently exhibited.

[2] A ceramic structure of the present invention preferably includes:
a ceramic base member having a main face;
a hole extending from the main face into the ceramic base member;
a metal electrode layer embedded in the ceramic base member;
a conductive member formed from tungsten or molybdenum, and embedded in the ceramic base member so as to be electrically connected to the metal electrode layer and form a bottom of the hole;
a first metal member formed from a material identical to that of the conductive member, the first metal member being joined to the conductive member by a brazing material;
one or a plurality of second metal members which are formed from kovar and which are disposed on a face, of the first metal member, that is at a side opposite to a face, of the first metal member, that is opposed to the conductive member; and
a metal terminal which contains nickel, which is at least partially located in the hole, and which is joined to the one or the plurality of second metal members, wherein
a distance between the conductive member and the metal terminal is not less than 1.5 mm, and a ratio of a thickness of the first metal member and a thickness of second metal member is less than 4.

In other words, a ceramic structure of the present invention includes: a ceramic base member having a main face, the ceramic base member defining a hole extending from the main face into the ceramic base member; a metal electrode layer embedded in the ceramic base member; a conductive member formed from tungsten or molybdenum, the conductive member embedded in the ceramic base member so as to be electrically connected to the metal electrode layer, the conductive member forming a bottom of the hole; a first metal member formed from a material identical to that of the conductive member, the first metal member joined to the conductive member by a brazing material, the first metal member having a first front surface that is opposed to the conductive member and a first back surface that is opposite to the first front surface; one or more second metal members formed from kovar, the one or more second metal members disposed at the first back surface of the first metal member; and a metal terminal containing nickel, the metal terminal at least partially located in the hole and joined to the one or more second metal members, wherein a distance between the conductive member and the metal terminal is not less than 1.5 mm, and a ratio of a thickness of the first metal member and a thickness of the one or more second metal members is less than 4.

In this configuration, since the first metal member and the conductive member are formed from the same material, the average linear expansion coefficients of the conductive member and the first metal member can be made the same. Since the second metal member is formed from kovar and the metal terminal contains nickel, the advantageous effect of the functionally-graded average linear expansion coefficients from the second metal member to the metal terminal can be exhibited.

[3] Preferably, in the ceramic structure of the present invention, an average grain diameter of the first metal member is smaller than an average grain diameter of the conductive member.

In this configuration, since the first metal member has a smaller average grain diameter than the conductive member, the strength and the toughness of the member can be maintained high at a certain level.

[4] Preferably, in the ceramic structure of the present invention, a gap is formed between: the first metal member, the second metal member, and the metal terminal; and an inner side face, of the ceramic base member, which defines the hole. In other words, the ceramic base member has an inner side face that defines the hole and a gap is formed between the inner side face and: the first metal member, the one or more second metal members, and the metal terminal.

In this configuration, since the gap is provided, even if the first metal member and the second metal member expand, it is possible to inhibit the first metal member and the second metal member from coming into contact with the inner side face of the ceramic base member defining the hole, and thus it is possible to prevent occurrence of a crack in the ceramic base member.

[5] Preferably, in the ceramic structure of the present invention, the first metal member is a plate-like member including: a first front surface as a face opposed to the conductive member; a first back surface as a face at a side opposite to the first front surface; and a first side face connecting the first front surface and the first back surface, the second metal member (i.e., each of the one or more second metal members) is a plate-like member including: a second front surface facing the first metal member side; a second back surface at a side opposite to the second front surface; and a second side face connecting the second front surface and the second back surface, the metal terminal is a columnar member having: an end face opposed to the second metal member (i.e., the one or more second metal members); and a side face connected to the end face, and at least one of the following is chamfered:
a corner portion formed between the first back surface and the first side face of the first metal member,
a corner portion formed between the second front surface and the second side face of the second metal member,
a corner portion formed between the second back surface and the second side face of the second metal member, and
a corner portion formed between the end face and the side face of the metal terminal.

In this configuration, since the brazing material is held in the chamfered portion, the brazing material is inhibited from entering the gap. Accordingly, the gap can be maintained. Thus, even if the first metal member and the second metal member expand, it is possible to inhibit the first metal member and the second metal member from coming into contact with the inner side face of the ceramic base member defining the hole, and thus, it is possible to further prevent occurrence of a crack in the ceramic base member.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A. First Embodiment

Hereinafter, an embodiment of the present invention will be described with reference to the drawings. The drawings show a ceramic structure 1 conceptually (schematically).

Figure 1:
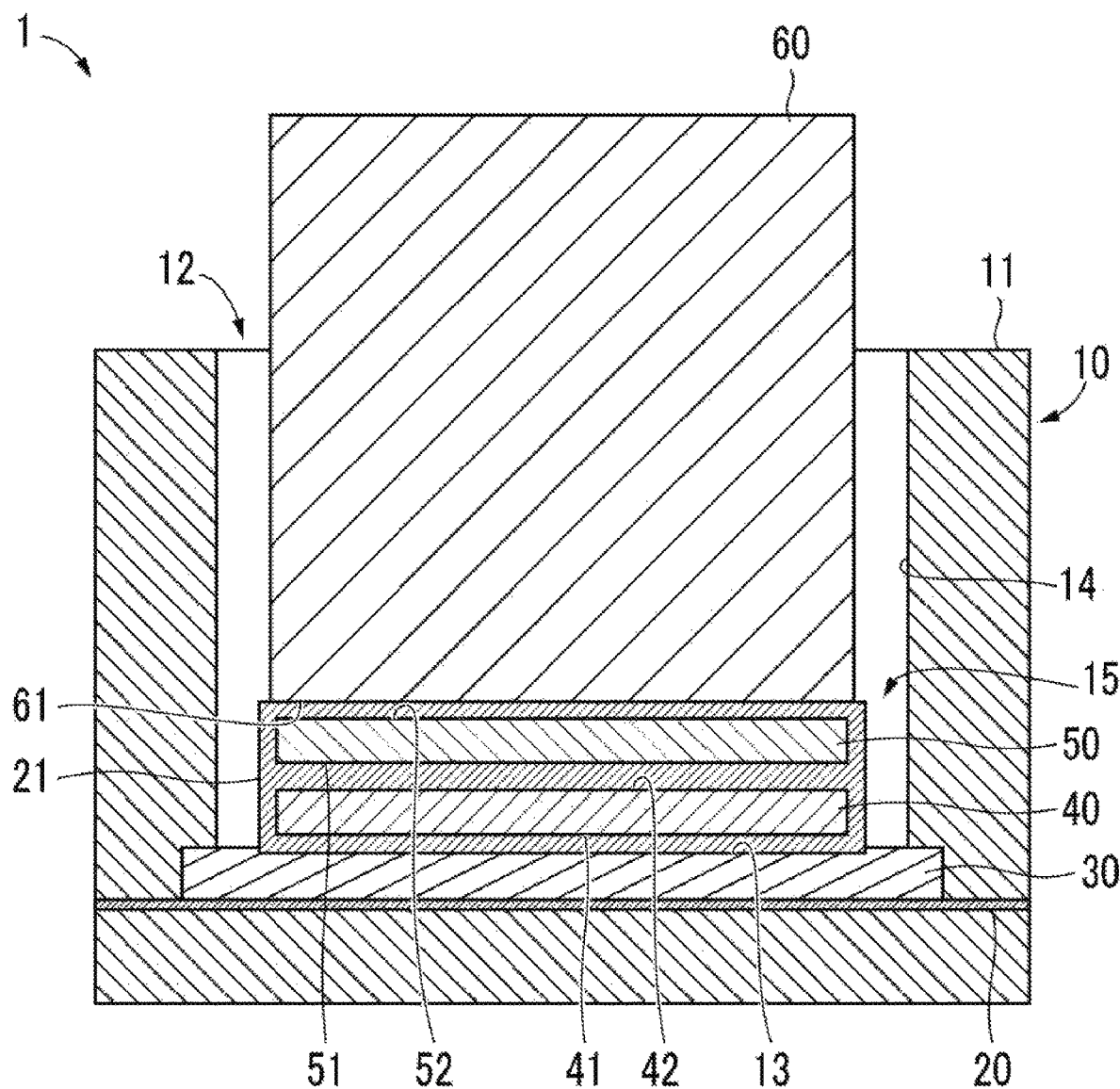
FIG. 1 is a cross-sectional view showing a ceramic structure of the present invention.
Figure 2:
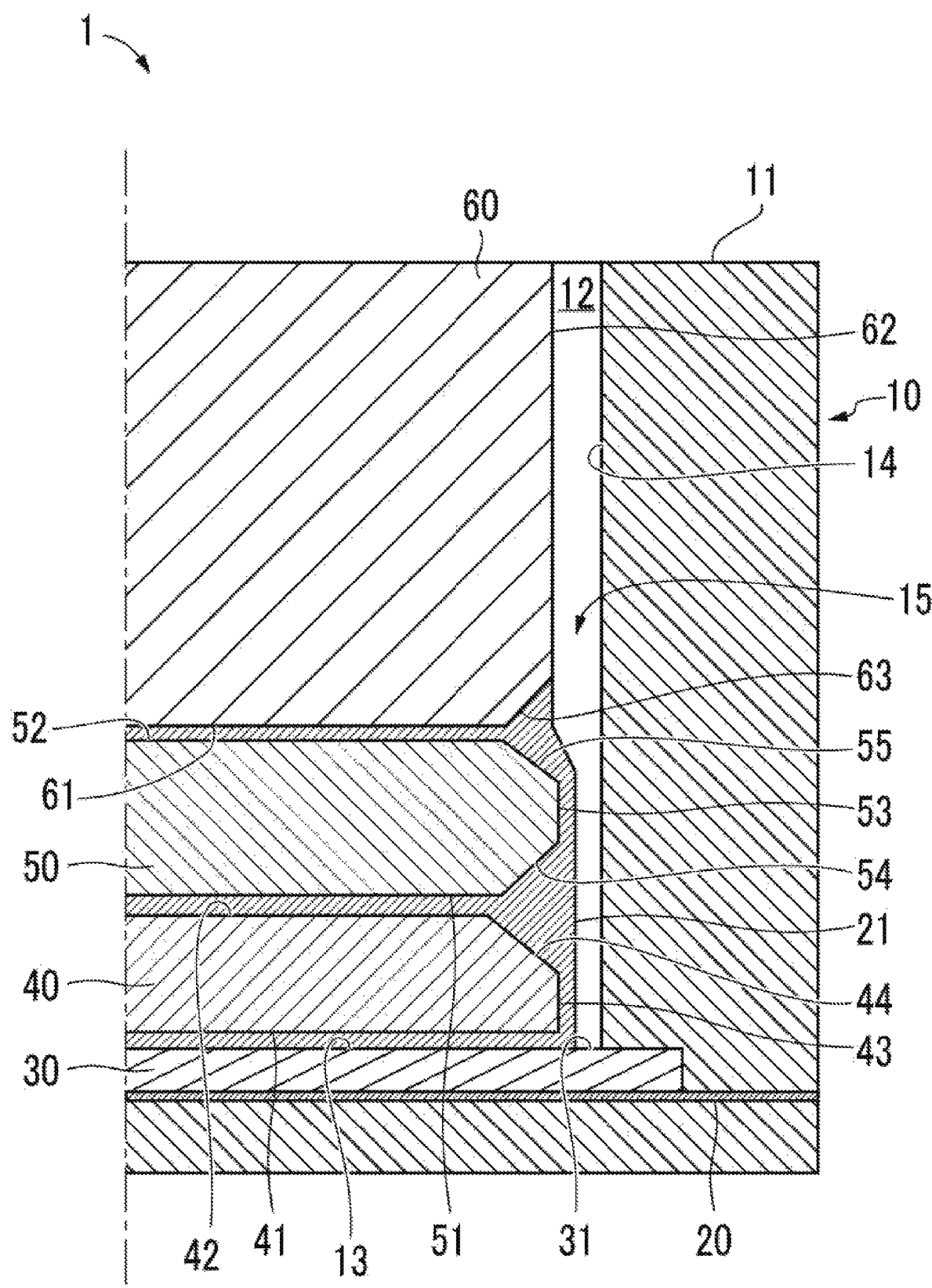
FIG. 2 is an enlarged view of a main part of the ceramic structure shown in FIG. 1.

As shown in FIG. 1 and FIG. 2, the ceramic structure 1 includes: a ceramic base member 10 having a main face 11; a hole 12 extending from the main face 11 into the ceramic base member 10; a metal electrode layer 20 embedded in the ceramic base member 10; and a conductive member 30 embedded in the ceramic base member 10 so as to be electrically connected to the metal electrode layer 20 and form a bottom 13 of the hole 12.

The ceramic structure 1 is a heater or an electrostatic chuck that is used in order to place a semiconductor wafer in a semiconductor manufacturing device. The ceramic base member 10 is a plate-like member formed from aluminum nitride, and a semiconductor wafer is to be placed on the surface at the side opposite to the main face 11. The ceramic base member 10 may be formed from another ceramic material such as alumina, instead of aluminum nitride. The metal electrode layer 20 is used as an attraction electrode, a heater electrode, or a high frequency generation electrode, and is a mesh or a foil formed from molybdenum.

Further, the ceramic structure 1 includes: a first metal member 40 joined to the conductive member 30 by a brazing material 21 and having an average linear expansion coefficient not less than the average linear expansion coefficient of the conductive member 30; one or a plurality of second metal members 50 which are disposed on the face (first back surface) 42, of the first metal member 40, that is at the side opposite to the face (first front surface) 41, of the first metal member 40, that is opposed to the conductive member 30, and which have a greater average linear expansion coefficient than the first metal member 40; and a metal terminal 60 which is at least partially located in the hole 12, which is joined to the one or the plurality of second metal members 50, and which has a greater average linear expansion coefficient than each second metal member 50.

A gap 15 is formed between: the first metal member 40, the second metal member 50, and the metal terminal 60; and an inner side face 14, of the ceramic base member 10, which defines the hole 12. The width of the gap 15 is 0.1 [mm].

In the embodiment, the width of the gap 15 is set to 0.1 [mm]. However, not limited thereto, the width of the gap 15 may be 0.05 [mm], 0.3 [mm], or the like as long as a gap is provided. Preferably, the width of the gap 15 is not less than 0.1 [mm], and further, it is sufficient that the gap is greater than 0. Part of the conductive member 30 has an exposed face 31 which is exposed in the hole 12.

The conductive member 30 is a plate-like member and is formed from tungsten. The first metal member 40 is a plate-like member including: the first front surface 41 as a face opposed to the conductive member 30; the first back surface 42 as a face at the side opposite to the first front surface 41; and a first side face 43 connecting the first front surface 41 and the first back surface 42. The first metal member 40 is formed from tungsten.

The second metal member 50 is a plate-like member including: a second front surface 51 facing the first metal member 40 side; a second back surface 52 at the side opposite to the second front surface 51; and a second side face 53 connecting the second front surface 51 and the second back surface 52. The second metal member 50 is formed from kovar.

The metal terminal 60 is a columnar member which has: an end face 61 opposed to the second metal member 50; and a side face 62 connected to the end face 61. The metal terminal 60 contains nickel. As the brazing material 21, a so-called Au brazing material (BAu1 to BAu12) can be applied, and BAu-4 (Au—Ni based) is suitable. As the brazing material 21, a so-called Ni brazing material (BNi1 to BNi7) is also applicable.

The average linear expansion coefficient of each material at 1 [atm] (1013.25 [hPa]) and 20 [° C.] is as follows: substantially 4.3 [×10$^{-6}$/° C.] (tungsten); substantially 4.8 [×10$^{-6}$/° C.] (kovar); 13.3 [×10$^{-6}$/° C.](nickel); and 14.2 [×10$^{-6}$/° C.] (gold).

A first chamfered portion 44 is formed at the corner portion formed between the first back surface 42 and the first side face 43 of the first metal member 40. A second chamfered portion 54 is formed at the corner portion formed between the second front surface 51 and the second side face 53 of the second metal member 50. A third chamfered portion 55 is formed at the corner portion formed between the second back surface 52 and the second side face 53 of the second metal member 50. A fourth chamfered portion 63 is formed at the corner portion formed between the end face 61 and the side face 62 of the metal terminal 60.

The chamfer dimensions of the first chamfered portion 44, the second chamfered portion 54, the third chamfered portion 55, and the fourth chamfered portion 63 are C0.1 to C0.5 [mm].

The chamfer dimensions of the first chamfered portion 44, the second chamfered portion 54, the third chamfered portion 55, and the fourth chamfered portion 63 are not limited to the values above, and may be values greater than 0.5 [mm]. Alternatively, a so-called thread chamfer may be employed. Further, the first chamfered portion 44, the second chamfered portion 54, the third chamfered portion 55, and the fourth chamfered portion 63 may be absent (chamfering may not be provided).

It is sufficient that at least one of: the corner portion formed between the first back surface 42 and the first side face 43 of the first metal member 40; the corner portion formed between the second front surface 51 and the second side face 53 of the second metal member 50; the corner portion formed between the second back surface 52 and the second side face 53 of the second metal member 50; and the corner portion formed between the end face 61 and the side face 62 of the metal terminal 60, is chamfered.

Next, actions and effects will be described. The conductive member 30 embedded in the ceramic base member 10 is subjected to a sintering temperature of not less than 1800° C. and grain growth occurs therein, and thus, the conductive member 30 becomes vulnerable and the strength is reduced. However, the first metal member 40 in which grain growth has not occurred and which has an average linear expansion coefficient not less than the average linear expansion coefficient of the conductive member 30 is placed on the conductive member 30, and further, the second metal member 50 having an average linear expansion coefficient greater than the average linear expansion coefficient of the first metal member 40 and smaller than the average linear expansion coefficient of the metal terminal 60 is placed on the first metal member 40. Accordingly, the stress caused by the difference in the average linear expansion coefficient between the conductive member 30 and the metal terminal 60 is received by the first metal member 40 and the second metal member 50, whereby the stress acting on the conductive member 30 can be suppressed.

The conductive member 30 is joined with the first metal member 40, the second metal member 50, and the metal terminal 60 in this order with the average linear expansion coefficients thereof graded so as to be increased in this order. Accordingly, the stress acting between the conductive member 30 and the first metal member 40, the stress acting between the first metal member 40 and the second metal member 50, and the stress acting between the second metal member 50 and the metal terminal 60 can be suppressed. Therefore, occurrence of a crack in the conductive member 30 can be prevented.

The distance between the conductive member 30 and the metal terminal 60 is not less than 1.5 [mm]. Not a thin member such as a foil, but the first metal member 40 and the second metal member 50 which are relatively thick and thus realize a distance of not less than 1.5 [mm] between the conductive member 30 and the metal terminal 60 are disposed between the conductive member 30 and the metal terminal 60. Therefore, a large distance between the conductive member 30 and the metal terminal 60 can be realized. Accordingly, the stress acting between the conductive member 30 and the metal terminal 60 can be suppressed. Since the ratio of the thickness of the first metal member 40 to the thickness of the second metal member 50 is less than 4, the proportion of the thickness of the first metal member 40 to the second metal member 50 is not too large, and the advantageous effect of the functionally-graded average linear expansion coefficient of the first metal member 40 can be sufficiently exhibited.

Since the gap 15 is provided, even if the first metal member 40 and the second metal member 50 expand, it is possible to inhibit the first metal member 40 and the second metal member 50 from coming into contact with the inner side face 14 of the ceramic base member 10 defining the hole 12, and thus it is possible to prevent occurrence of a crack in the ceramic base member 10.

Since at least one of the first chamfered portion 44, the second chamfered portion 54, the third chamfered portion 55, and the fourth chamfered portion 63 is formed, and the brazing material is held in the chamfered portion, the brazing material is inhibited from entering the gap 15. Accordingly, the gap 15 can be maintained. Thus, even if the first metal member 40 and the second metal member 50 expand, it is possible to inhibit the first metal member 40 and the second metal member 50 from coming into contact with the inner side face 14 of the ceramic base member 10 defining the hole 12, and thus, it is possible to further prevent occurrence of a crack in the ceramic base member 10.

In particular, in the second side face 53 of the second metal member 50, when the brazing material is charged between the second side face 53 and the inner side face 14, a crack could occur. However, since at least one of the first chamfered portion 44, the second chamfered portion 54, the third chamfered portion 55, and the fourth chamfered portion 63 is formed so as to hold the brazing material, occurrence of a crack can be further inhibited. In the schematic diagrams of FIG. 1 and FIG. 2, the brazing material is present such that the gap 15 remains between the metal members 40, 50 and the inner side face 14, i.e., such that the exposed face 31 is exposed over the entire perimeter of the metal members 40, 50. However, the brazing material may be extended in the radial direction of the hole 12 so as to prevent part or the entirety of the exposed face 31 of the conductive member 30 from being exposed in the circumferential direction.

The conductive member 30 and the first metal member 40 are formed from tungsten, and the second metal member 50 is formed from kovar. In a case where the conductive member 30 embedded in the ceramic base member 10 is formed from tungsten, if the first metal member 40 is formed from tungsten, which is the same material as that of the conductive member 30, the conductive member 30 and the first metal member 40 expand at the same rate, and the conductive member 30 having been subjected to the sintering temperature does not receive a large amount of stress. Accordingly, occurrence of a crack in the conductive member 30 can be further prevented.

Since the second metal member 50 is formed from kovar, stress is caused in the first metal member 40. However, since the first metal member 40 has not been subjected to the sintering temperature and the strength thereof is high, occurrence of a crack in the first metal member 40 can be prevented. In a case where a material containing nickel is used for the metal terminal 60, since kovar forming the second metal member 50 has an average linear expansion coefficient between that of nickel forming the metal terminal 60 and that of tungsten forming the first metal member 40, a gradient in the average linear expansion coefficient is caused from the metal terminal 60 toward the conductive member 30, and thus, expansion of each metal can be gradually absorbed.

The intermediate members (the first metal member 40 and the second metal member 50) disposed between the conductive member 30 and the metal terminal 60 are provided as two layers having relatively large thicknesses compared with foils. In addition, the tungsten conductive member 30 which is an embedded metal, a plurality of intermediate members inserted during brazing, and the metal terminal 60 containing nickel are disposed in this order such that the magnitudes of the average linear expansion coefficients are increased in this order without being reversed. Therefore, the stress acting between the intermediate members (the first metal member 40 and the second metal member 50) and the conductive member 30 or the metal terminal 60 can be further suppressed.

Since the first metal member 40 and the conductive member 30 are formed from the same material, the average linear expansion coefficients of the conductive member 30 and the first metal member 40 can be made the same. Since the second metal member 50 is formed from kovar and the metal terminal 60 contains nickel, the advantageous effect of the functionally-graded average linear expansion coefficients from the second metal member 50 to the metal terminal 60 can be exhibited.

Next, described is the reason why occurrence of a crack can be satisfactorily suppressed if the distance between the conductive member 30 and the metal terminal 60 is set to not less than 1.5 [mm].

The evaluation method was as follows. The hole diameter of the hole 12 of the ceramic base member 10 was set to ϕ4.2 [mm], the conductive member 30 formed from tungsten was used, the diameter of the first metal member 40 was set to ϕ4.0 [mm], the diameter of the second metal member 50 was set to ϕ4.0 [mm], the metal terminal 60 containing nickel was used, and tests were performed while the thicknesses of the first metal member 40 and the second metal member 50 were changed as shown in Table 1. In Table 1, "○" represents a case where no crack occurred in the ceramic base member 10 and the conductive member 30, and "x" represents a case where a crack occurred. In each test, a cyclic heating test of repeating 10 times a temperature cycle in which the ceramic structure was heated from room temperature to 600° C. and then cooled to room temperature; and a high temperature storage test of leaving the ceramic structure to stand at 600° C. for 300 hours, were performed in this order. Then, the presence/absence of occurrence of a crack was confirmed by viewing. In addition, a tensile strength test was performed on the metal terminal 60 and the presence/absence of occurrence of a crack was confirmed by observing an SEM photograph of a cross section.

The table below shows the results of the tests described above.

TABLE 1

| Test number | First metal member Material | First metal member Thickness (mm) | Second metal member Material | Second metal member Thickness (mm) | Pass/Failure |
|---|---|---|---|---|---|
| Comparative Example 1 | tungsten | 1 | none | — | x |
| Comparative Example 2 | tungsten | 0.2 | kovar | 1 | x |
| Example 1 | tungsten | 0.5 | kovar | 1 | ○ |
| Example 2 | tungsten | 1 | kovar | 1 | ○ |
| Example 3 | tungsten | 1.5 | kovar | 1 | ○ |
| Example 4 | tungsten | 2 | kovar | 1 | ○ |
| Example 5 | tungsten | 3 | kovar | 1 | ○ |
| Comparative Example 3 | tungsten | 4 | kovar | 1 | x |
| Comparative Example 4 | tungsten | 1 | kovar | 0.2 | x |
| Example 6 | tungsten | 1 | kovar | 0.5 | ○ |
| Example 7 | tungsten | 1 | kovar | 1 | ○ |
| Example 8 | tungsten | 1 | kovar | 2 | ○ |
| Example 9 | tungsten | 1 | kovar | 3 | ○ |
| Comparative Example 5 | tungsten | 1 | kovar | 4 | x |
| Comparative Example 6 | kovar | 1 | tungsten | 1 | x |
| Example 10 | tungsten | 1 gold surface plating 1 μm | kovar | 1 | ○ |
| Example 11 | tungsten | 1 gold surface plating 1 μm | kovar | 1 gold surface plating 1 μm | ○ |
| Example 12 | tungsten | 1 gold surface plating 1 μm | kovar | 1 gold surface plating 1 μm | ○ |

With reference to Table 1, Example 1 to Example 12 had no occurrence of a crack and are indicated as pass "○". Comparative Example 1 to Comparative Example 5 had occurrence of a crack and are indicated as failure "x". On the basis of the results above, the distance between the conductive member 30 and the metal terminal 60 is set to not less than 1.5 [mm].

In Comparative Example 1, the difference in the average linear expansion coefficient between the conductive member 30 and the metal terminal 60 did not cause reduction of the stress. In Comparative Example 2, since the total thickness of the first metal member 40 and the second metal member 50 was insufficient, the distance between the conductive member 30 and the metal terminal 60 was small, and the stress due to the difference in the average linear expansion coefficient was not sufficiently reduced. As a result, a crack occurred in the conductive member 30.

In Comparative Example 3, since the proportion of the thickness of the first metal member 40 to the second metal member 50 was too large, the advantageous effect of the functionally-graded average linear expansion coefficient of the first metal member 40 was not sufficiently exhibited. In other words, displacement in the plane direction of the second metal member 50 was suppressed by the first metal member 40, and did not sufficiently expand.

In Comparative Example 4, the total thickness of the first metal member 40 and the second metal member 50 was insufficient. In Comparative Example 5, since the proportion of the thickness of the first metal member 40 to the second metal member 50 was too small, the stress due to the difference in the average linear expansion coefficient between the second metal member 50 and the conductive member 30 was increased. As a result, a crack occurred in the conductive member 30.

In Comparative Example 6, the magnitudes of the average linear expansion coefficients of the first metal member 40 and the second metal member 50 were reversed. Therefore, a crack occurred in a weak place due to the stress caused by the difference in the average linear expansion coefficient between the conductive member 30 and the first metal member 40, between the first metal member 40 and the second metal member 50, or between the second metal member 50 and the metal terminal 60.

Next, an Example in which the conductive member 30 was formed from molybdenum is shown.

TABLE 2

| | First metal member | | Second metal member | | Pass/ |
|---|---|---|---|---|---|
| | Material | Thickness mm | Material | Thickness | Failure |
| Example 13 | molybdenum | 0.5 | kovar | 1 | ○ |

With reference to Table 2, Example 13 had no occurrence of a crack and is indicated as pass "0". This result reveals that it is sufficient that the ascending order of the average linear expansion coefficients from the conductive member to the metal terminal is maintained while the distance between the conductive member 30 and the metal terminal 60 is set to not less than 1.5 [mm].

The grain structures in cross sections of the conductive member 30 of Comparative Example 1 and the conductive member 30 and the first metal member 40 of Example 1 and Example 13 were observed, and the grain diameters were measured. The grain diameter measurement was performed as follows. According to an intercept method, a cross-sectional surface was polished, and then, an image at the magnification of 5000 times was obtained by an SEM (Scanning Electron Microscope). Then, the grain diameters were measured on the basis of the distances between grain boundaries crossing arbitrarily-drawn five straight lines. The median of the minimum value and the maximum value of the measured grain diameters was used as the average grain diameter of the conductive member 30 and the first metal member 40.

Table 3 shows the results. The grain diameter of the conductive member before being subjected to sintering and brazing was 2 to 4 μm.

TABLE 3

| | Conductive member | First metal member | Grain diameter of conductive member after brazing (μm) | Grain diameter of first metal member after brazing (μm) |
|---|---|---|---|---|
| Comparative Example 1 | tungsten | none | 6 to 34 | — |
| Example 1 | tungsten | tungsten | 6 to 34 | 3 to 10 |
| Example 13 | molybdenum | molybdenum | 18 to 33 | 3 to 10 |

With reference to Table 3, when Example 1 and Comparative Example 1 are compared, even when the compositions of the members are the same, the first metal member 40, of Example 1, which has been subjected to the brazing temperature only has a smaller average grain diameter than the conductive member 30, of Comparative Example 1 and Example 1, which has been subjected to the sintering temperature. Thus, it is speculated that the strength and the toughness of the member are maintained high at a certain level. Therefore, it is inferred that: the stress induced when brazing the conductive member 30 and the metal terminal 60 was not directly applied on the conductive member 30 having reduced strength, but was received to a certain extent by the first metal member 40 having the strength thereof maintained; and as a result, an effect of inhibiting occurrence of a crack in the conductive member 30 was exhibited.

Also in Example 13 where the evaluation was good, it was found that the average grain diameter of the first metal member 40 was maintained to be small when compared with that of the conductive member 30.

Next, a method for manufacturing the ceramic structure 1 is described. In step 1, an aluminum nitride ceramic sintered body (the ceramic base member 10) having embedded therein a molybdenum metal electrode layer 20 and a tungsten conductive member 30 is made.

In step 2, a hole for connecting a nickel metal terminal 60 for feeding is formed by machining at the position, in the ceramic base member 10, where the conductive member 30 is embedded, whereby part of the embedded conductive member 30 is exposed.

In step 3, in the hole 12, the brazing material 21 is placed on the conductive member 30; on top of that, a tungsten pellet (thickness: not less than 0.5 [mm] and not greater than 2 [mm]) having a smaller diameter than the hole is placed; on top of that, the brazing material 21 is placed; on top of that, a kovar pellet (thickness: not less than 0.5 [mm] and not greater than 2 [mm]) is placed; on top of that, the brazing material 21 is placed; and on top of that, the nickel metal terminal 60 is placed.

In step 4, brazing is performed at 1000 to 1200 [° C.] in a vacuum furnace. Through these steps 1 to 4, the ceramic structure 1 is obtained.

Figure 3:
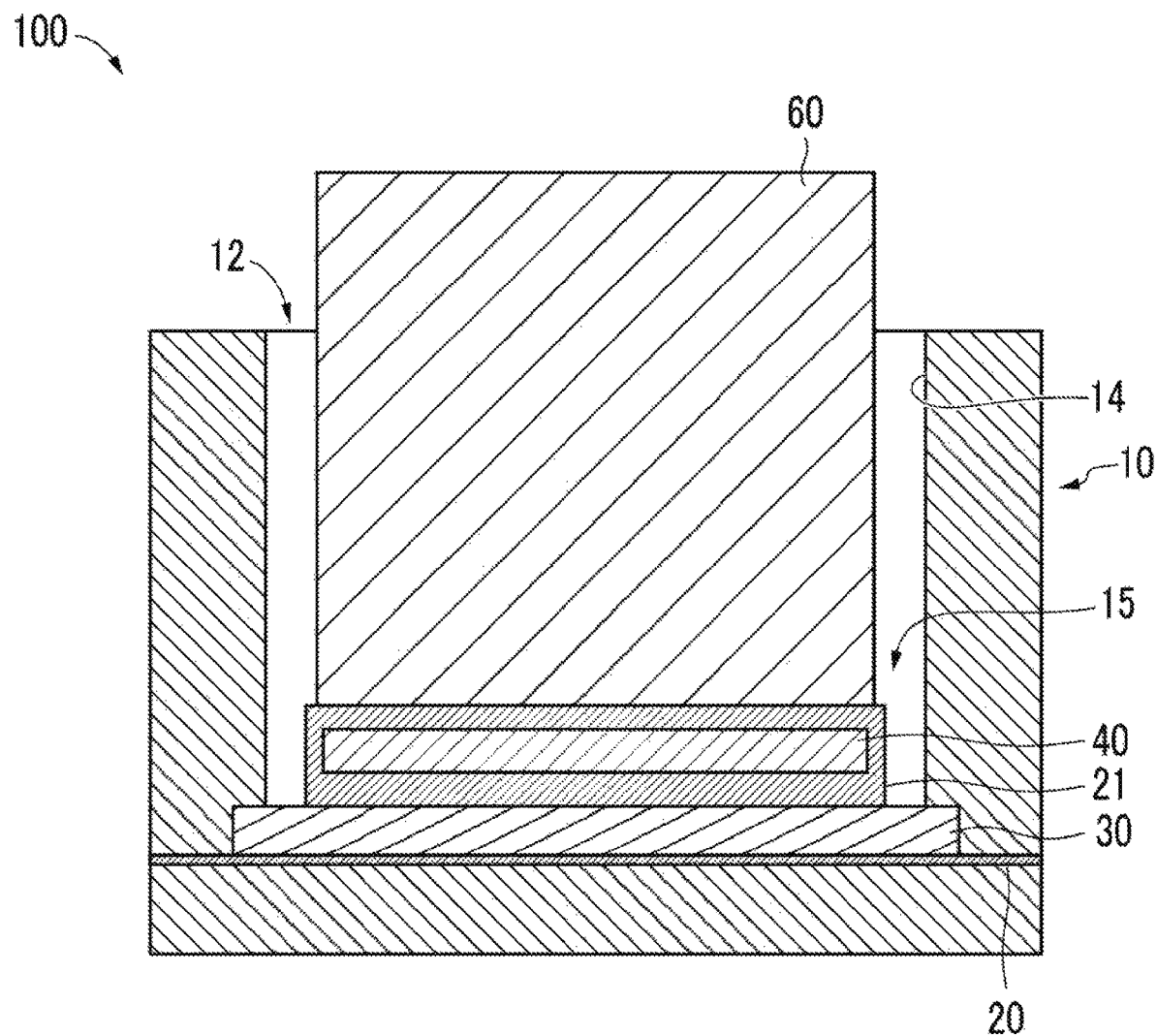
FIG. 3 is a cross-sectional view showing a ceramic structure of a first comparative example.

Next, comparative examples are described. As shown in FIG. 3, a first comparative example is Comparative Example 1 in Table 1. A ceramic structure 100 includes: a metal electrode layer 20 and a tungsten conductive member 30 which are embedded in the ceramic base member 10; a tungsten first metal member 40 placed on the conductive member 30; and a nickel metal terminal 60 placed on the first metal member 40. Each member is brazed by the brazing material 21. In the first comparative example (Comparative Example 1), the difference in the average linear expansion coefficient between the conductive member 30 and the metal terminal 60 does not cause reduction of the stress, and thus, a crack occurs in the conductive member.

Figure 4:
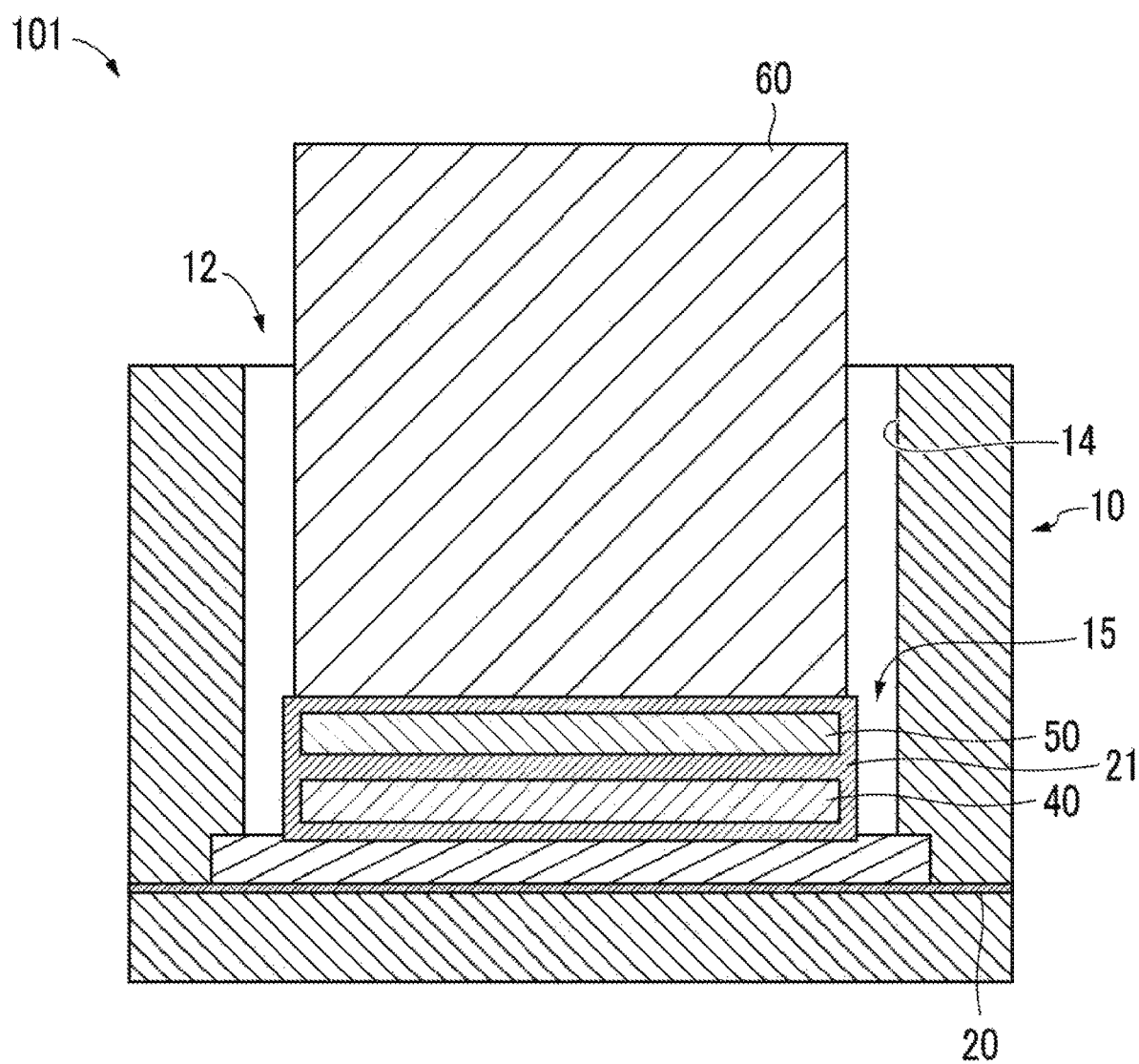
FIG. 4 is a cross-sectional view showing a ceramic structure of a second comparative example.

As shown in FIG. 4, a second comparative example is Comparative Example 6 in Table 1. A ceramic structure 101 includes: a metal electrode layer 20 and a tungsten conductive member 30 which are embedded in the ceramic base member 10; a kovar first metal member 40 placed on the conductive member 30; a tungsten second metal member 50 placed on the first metal member 40; and a nickel metal terminal 60 placed on the second metal member 50. Each member is brazed by the brazing material 21. In the second comparative example (Comparative Example 6), the magnitudes of the average linear expansion coefficients of the first metal member 40 and the second metal member 50 are reversed. Therefore, a crack occurs in a weak place due to the stress caused by the difference in the average linear expansion coefficient between the members.

In the embodiment, the conductive member 30 and the first metal member 40 are formed from tungsten, the second metal member 50 is formed from kovar, and the metal terminal 60 is a member containing nickel. However, not limited thereto, other general materials may be used as long as the average linear expansion coefficients of the conductive member 30, the first metal member 40, the second metal member 50, and the metal terminal 60 are increased in an ascending order in this order.

In the embodiment, the hole diameter of the hole 12 in the ceramic base member 10, the diameter of the first metal member 40, and the diameter of the second metal member 50 are merely examples. As long as no crack occurs in the members, these diameters may be changed as appropriate such that, for example, the hole diameter of the hole 12 is set to 45.2 [mm], and the diameter of the first metal member 40 and the second metal member 50 is set to 45.0 [mm].

DESCRIPTION OF REFERENCE NUMERALS

1: ceramic structure
10: ceramic base member
11: main face
12: hole
13: bottom
14: inner side face
15: gap
20: metal electrode layer
21: brazing material
30: conductive member (tungsten)
31: exposed face
40: first metal member (tungsten)
41: opposing face (first front surface)
42: face at opposite side (first back surface)
43: first side face
50: second metal member (kovar)
51: second front surface
52: second back surface
53: second side face
60: metal terminal (nickel)
61: opposing end face
62: side face

What is claimed is:

1. A ceramic structure comprising:
   a ceramic base member having a main face, the ceramic base member defining a hole extending from the main face into the ceramic base member;
   a metal electrode layer embedded in the ceramic base member;
   a conductive member embedded in the ceramic base member so as to be electrically connected to the metal electrode layer, the conductive member forming a bottom of the hole;
   a first metal member joined to the conductive member by a brazing material, the first metal member having a first front surface that is opposed to the conductive member and a first back surface that is opposite to the first front surface, and the first metal member having an average linear expansion coefficient not less than an average linear expansion coefficient of the conductive member;
   one or more second metal members disposed at the first back surface of the first metal member, each of the one or more second metal members having a greater average linear expansion coefficient than the average linear expansion coefficient of the first metal member; and
   a metal terminal at least partially located in the hole and joined to the one or more second metal members, the metal terminal having a greater average linear expansion coefficient than the average linear expansion coefficient of each of the one or more second metal members,
   wherein a distance between the conductive member and the metal terminal is not less than 1.5 mm, and a ratio of a thickness of the first metal member and a thickness of the one or more second metal members is less than 4.

2. A ceramic structure comprising:
   a ceramic base member having a main face, the ceramic base member defining a hole extending from the main face into the ceramic base member;
   a metal electrode layer embedded in the ceramic base member;
   a conductive member formed from tungsten or molybdenum, the conductive member embedded in the ceramic base member so as to be electrically connected to the metal electrode layer, the conductive member forming a bottom of the hole;
   a first metal member formed from a material identical to that of the conductive member, the first metal member joined to the conductive member by a brazing material, the first metal member having a first front surface that is opposed to the conductive member and a first back surface that is opposite to the first front surface;
   one or more second metal members formed from kovar, the one or more second metal members disposed at the first back surface of the first metal member; and
   a metal terminal containing nickel, the metal terminal at least partially located in the hole and joined to the one or more second metal members,
   wherein a distance between the conductive member and the metal terminal is not less than 1.5 mm, and a ratio of a thickness of the first metal member and a thickness of the one or more second metal members is less than 4.

3. The ceramic structure according to claim 1, wherein an average grain diameter of the first metal member is smaller than an average grain diameter of the conductive member.

4. The ceramic structure according to claim 1, wherein the ceramic base member has an inner side face that defines the hole and a gap is formed between the inner side face and: the first metal member, the one or more second metal members, and the metal terminal.

5. The ceramic structure according to claim 4, wherein the first metal member is a member plate including a first side face connecting the first front surface and the first back surface,
   each of the one or more second metal members is a member plate including:
      a second front surface facing the first metal member;
      a second back surface opposite to the second front surface; and
      a second side face connecting the second front surface and the second back surface,
   the metal terminal is a columnar member including:
      an end face opposed to the one or more second metal members; and
      a side face connected to the end face, and
   at least one of the following is chamfered:
      a corner portion formed between the first back surface and the first side face of the first metal member,
      a corner portion formed between the second front surface and the second side face of each of the one or more second metal members, a corner portion formed between the second back surface and the second side face of each of the one or more second metal members, and a corner portion formed between the end face and the side face of the metal terminal.

6. The ceramic structure according to claim 2, wherein an average grain diameter of the first metal member is smaller than an average grain diameter of the conductive member.

7. The ceramic structure according to claim 2, wherein the ceramic base member has an inner side face that defines the hole and a gap is formed between the inner side face and:
the first metal member, the one or more second metal members, and the metal terminal.

8. The ceramic structure according to claim 7, wherein the first metal member is a member plate including a first side face connecting the first front surface and the first back surface, each of the one or more second metal members is a member plate including:
a second front surface facing the first metal member;
a second back surface opposite to the second front surface; and
a second side face connecting the second front surface and the second back surface, the metal terminal is a columnar member including:
an end face opposed to the one or more second metal members; and
a side face connected to the end face, and at least one of the following is chamfered:
a corner portion formed between the first back surface and the first side face of the first metal member,
a corner portion formed between the second front surface and the second side face of each of the one or more second metal members,
a corner portion formed between the second back surface and the second side face of each of the one or more second metal members, and
a corner portion formed between the end face and the side face of the metal terminal.

\* \* \* \* \*